United States Patent
Kura et al.

(10) Patent No.: US 10,354,996 B2
(45) Date of Patent: Jul. 16, 2019

(54) METHOD OF MANUFACTURING A SEMICONDUCTOR DEVICE WITH AN UPPER SURFACE OF A SUBSTRATE AT DIFFERENT LEVELS

(71) Applicant: Renesas Electronics Corporation, Tokyo (JP)

(72) Inventors: Satoshi Kura, Tokyo (JP); Mitsuo Nissa, Tokyo (JP); Keiji Sakamoto, Tokyo (JP); Taichi Iwasaki, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/883,289

(22) Filed: Jan. 30, 2018

(65) Prior Publication Data

US 2018/0158816 A1 Jun. 7, 2018

Related U.S. Application Data

(63) Continuation of application No. 13/858,142, filed on Apr. 8, 2013, now Pat. No. 9,917,083.

(30) Foreign Application Priority Data

Apr. 20, 2012 (JP) ................. 2012-096641

(51) Int. Cl.
*H01L 21/8234* (2006.01)
*H01L 27/088* (2006.01)
(Continued)

(52) U.S. Cl.
CPC .... *H01L 27/088* (2013.01); *H01L 21/823418* (2013.01); *H01L 21/823437* (2013.01);
(Continued)

(58) Field of Classification Search
CPC .......... H01L 27/088; H01L 21/823418; H01L 21/823443; H01L 21/823456
(Continued)

(56) References Cited

U.S. PATENT DOCUMENTS 5,847,419 A 12/1998 Imai et al.
7,358,551 B2 4/2008 Chidambarrao et al.
(Continued)

FOREIGN PATENT DOCUMENTS

JP 2004-047524 A 2/2004
JP 2008-193013 A 8/2008
(Continued)

OTHER PUBLICATIONS

Office Action dated Jun. 29, 2017, in Chinese Patent Application No. 2013101486934.
(Continued)

*Primary Examiner* — Robert T Huber
(74) *Attorney, Agent, or Firm* — Shapiro, Gabor and Rosenberger, PLLC

(57) ABSTRACT

A first transistor required for decreasing leak current and a second transistor required for compatibility of high speed operation and low power consumption can be formed over an identical substrate and sufficient performance can be provided to the two types of the transistors respectively. Decrease in the leak current is required for the first transistor. Less power consumption and high speed operation are required for the second transistor. The upper surface of a portion of a substrate in which the second diffusion layer is formed is lower than the upper surface of a portion of the substrate where the first diffusion layer is formed.

7 Claims, 12 Drawing Sheets

(51) Int. Cl.
*H01L 27/108* (2006.01)
*H01L 49/02* (2006.01)

(52) U.S. Cl.
CPC ........... *H01L 21/823443* (2013.01); *H01L 21/823456* (2013.01); *H01L 27/10808* (2013.01); *H01L 27/10814* (2013.01); *H01L 27/10852* (2013.01); *H01L 27/10894* (2013.01); *H01L 27/10897* (2013.01); *H01L 28/24* (2013.01)

(58) Field of Classification Search
USPC ..................... 257/368, E21.437; 438/275
See application file for complete search history.

(56) References Cited

U.S. PATENT DOCUMENTS

| | | | | |
|---|---|---|---|---|
| 7,468,303 | B2* | 12/2008 | Sugihara | H01L 29/665 257/E21.438 |
| 8,193,063 | B2 | 6/2012 | Fukushima | |
| 8,237,205 | B2 | 8/2012 | Kamei et al. | |
| 8,309,414 | B2 | 11/2012 | Kawasaki et al. | |
| 8,796,779 | B2 | 4/2014 | Ito et al. | |
| 2007/0184601 | A1 | 8/2007 | Zhang et al. | |
| 2008/0099859 | A1 | 5/2008 | Watanabe | |
| 2010/0219485 | A1 | 9/2010 | Chong et al. | |
| 2011/0042749 | A1 | 2/2011 | Kawasaki et al. | |
| 2013/0056831 | A1 | 3/2013 | Ito et al. | |

FOREIGN PATENT DOCUMENTS

| | | |
|---|---|---|
| JP | 2010-067785 A | 3/2010 |
| JP | 2010-171086 A | 8/2010 |
| JP | 2011-003710 A | 1/2011 |
| JP | 2011-066391 A | 3/2011 |
| JP | 2011-071384 A | 4/2011 |
| JP | 2012-064648 A | 3/2012 |
| WO | WO 2012/035684 A1 | 3/2012 |

OTHER PUBLICATIONS

Office Action dated Oct. 19, 2016, in Chinese Patent Application No. 2013101486934.
Office Action dated Nov. 4, 2016, in Taiwanese Patent Application No. 102112213.
Office Action dated Jan. 8, 2018, in Taiwanese Patent Application No. 106132854.
Office Action dated Jan. 19, 2016, in Japanese Patent Application No. 2012-096641.

* cited by examiner

METHOD OF MANUFACTURING A SEMICONDUCTOR DEVICE WITH AN UPPER SURFACE OF A SUBSTRATE AT DIFFERENT LEVELS

CROSS-REFERENCE TO RELATED SPECIFICATIONS

The disclosure of Japanese Patent Application No. 2012-096641 filed on Apr. 20, 2012 including the specification, drawings, and abstract is incorporated herein by reference in its entirety.

BACKGROUND

The present invention concerns a semiconductor device and a method of manufacturing the semiconductor device and it particularly relates to a semiconductor device including two types of transistors having characteristics different from each other and a method of manufacturing the semiconductor device.

Some semiconductor devices include two or more types of transistors having characteristics different from each other. For example, a semiconductor having both memory and logic circuits mounted on one identical semiconductor chip includes transistors for reading and writing memory and transistors forming a logic circuit. Decrease in leak current is required for the former type transistor and compatibility of high speed operation and low power consumption is required for the latter type transistor. In such a case, the two types of transistors may be sometimes different from each other with respect to the partial structure. For example, Japanese Unexamined Patent Application Publication No. 2011-66391 describes that the width of a side wall is different between a transistor for memory and a transistor for logic circuit.

Further, Japanese Unexamined Patent Application Publication Nos. 2010-67785 and 2010-171086 describe that an offset spacer film has a dual layered structure. Further, Japanese Unexamined Patent Application Publication No. 2011-3710 describes that an offset spacer film is removed from a region that serves as a source and a drain and a silicon layer is grown epitaxially over the regions in transistors for which refinement is required as a DRAM.

SUMMARY

As described above, a transistor required for decrease in leak current and a transistor required for compatibility between high speed operation and low power consumption are sometimes formed on one identical substrate. On the other hand, refinement of semiconductor devices has been proceeded in recent years. Accordingly, it has become difficult to provide the two types of transistors with sufficient performance respectively.

Other objects and novel features of the invention will become apparent by reading the present specification in conjunction with the appended drawings.

According to one aspect of the invention, a first transistor and a second transistor are formed over a substrate. The upper surface of a region of a substrate in which a first diffusion layer that serves as a source and a drain of the first transistor is formed is situated above the upper surface of a region of the substrate in which a second diffusion layer that serves as a source and a drain of the second transistor is formed.

According to the aspect, the first transistor required for decrease in leak current and the second transistor required for compatibility between higher speed operation and low power consumption can be formed over one identical substrate and the two types of transistors can be provided with sufficient performance respectively.

DETAILED DESCRIPTION

Preferred embodiments of the invention are to be described with reference to the drawings. Throughout the drawings, identical configurational elements carry the same references for which explanations are to be omitted optionally.

First Embodiment

Figure 1A:
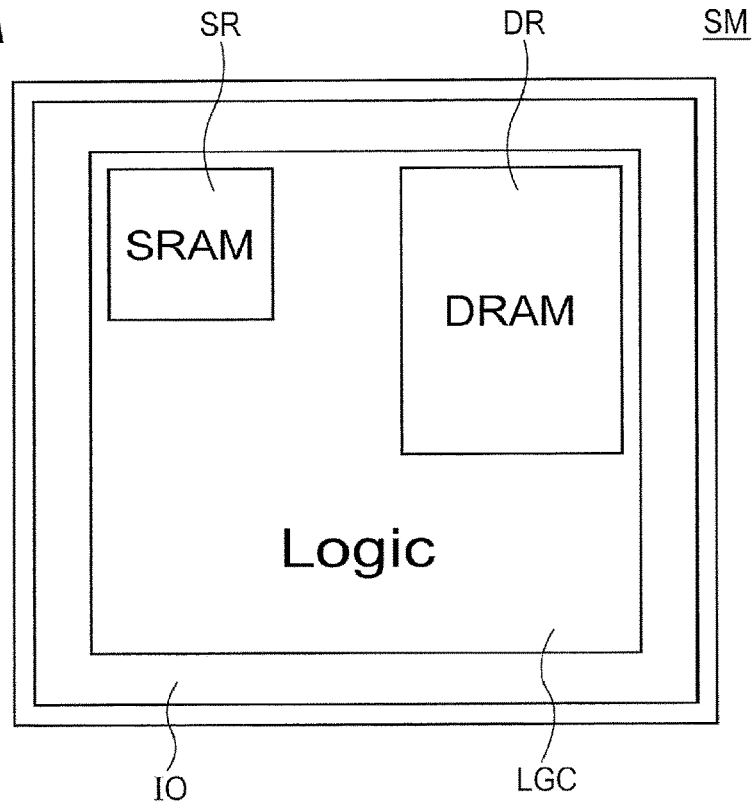
FIG. 1A is a plan view illustrating a configuration of a semiconductor device according to a first embodiment.

FIG. 1A is a plan view illustrating a configuration of a semiconductor device SM according to a first embodiment. The semiconductor device SM has a logic region LGC, a DRAM region DR, a SRAM region SR, and an I/O region IO. The logic region LGC has a logic circuit. The DRAM region DR has DRAM (Dynamic Random Access Memory). The SRAM region SR has SRAM (Static Random Access Memory). The I/O region IO has an I/O (Input/Output) circuit. Signal input-output to and from the semiconductor device SM and power source supply are performed by way of the I/O circuit. The I/O region IO illustrated in FIG. 1A is arranged along the edge of the semiconductor device SM and surrounds the logic region LGC, the DRAM region DR, and the SRAM region SR. It will be apparent that the layout of the semiconductor device SM is not restricted to such an example.

The semiconductor device SM may or may not have the SRAM region. Further, the semiconductor device SM also has a resistance forming region RE (not illustrated in the drawing). The resistance forming region RE has a resistance device RES (not illustrated in the drawing). The resistance device RES is, for example, a polysilicon resistance and formed over a device isolation film.

Figure 1B:
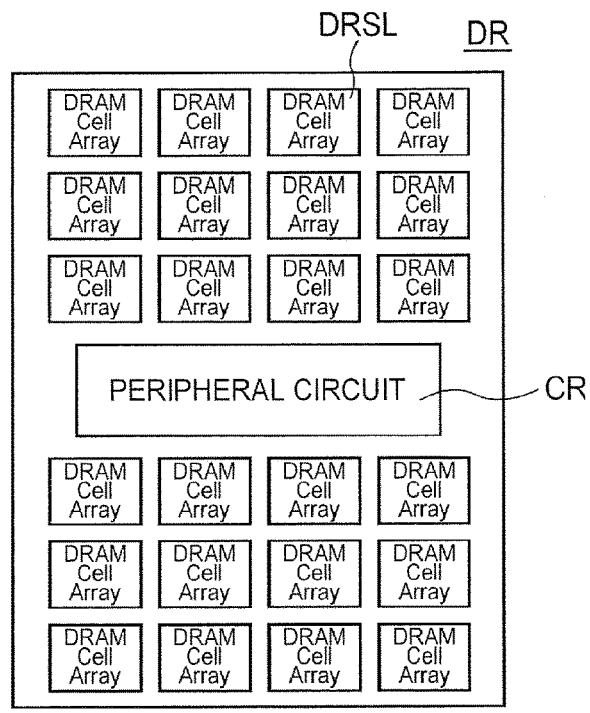
FIG. 1B is a plan view illustrating a layout for a DRAM region.

FIG. 1B is a plan view illustrating the layout of the DRAM region DR. The DRAM region DR has a plurality of memory cell arrays DRSL and a peripheral circuit CR. As will be described specifically later, the memory cell array DRSL has a capacitance device COM (not illustrated in the drawing) and a first transistor TRN (not illustrated in the drawing). The first transistor TR1 is a transistor for writing and reading to and from the capacitance device CON. Decrease in leak current is required for the first transistor TR1. On the other hand, decrease in the consumption power is required for a second transistor TR2 (not illustrated in the drawing) of the logic region LGC in FIG. 1A. Accordingly, the first transistor TR1 and the second transistor TR2 have partially different structures as will be described specifically.

Figure 2:
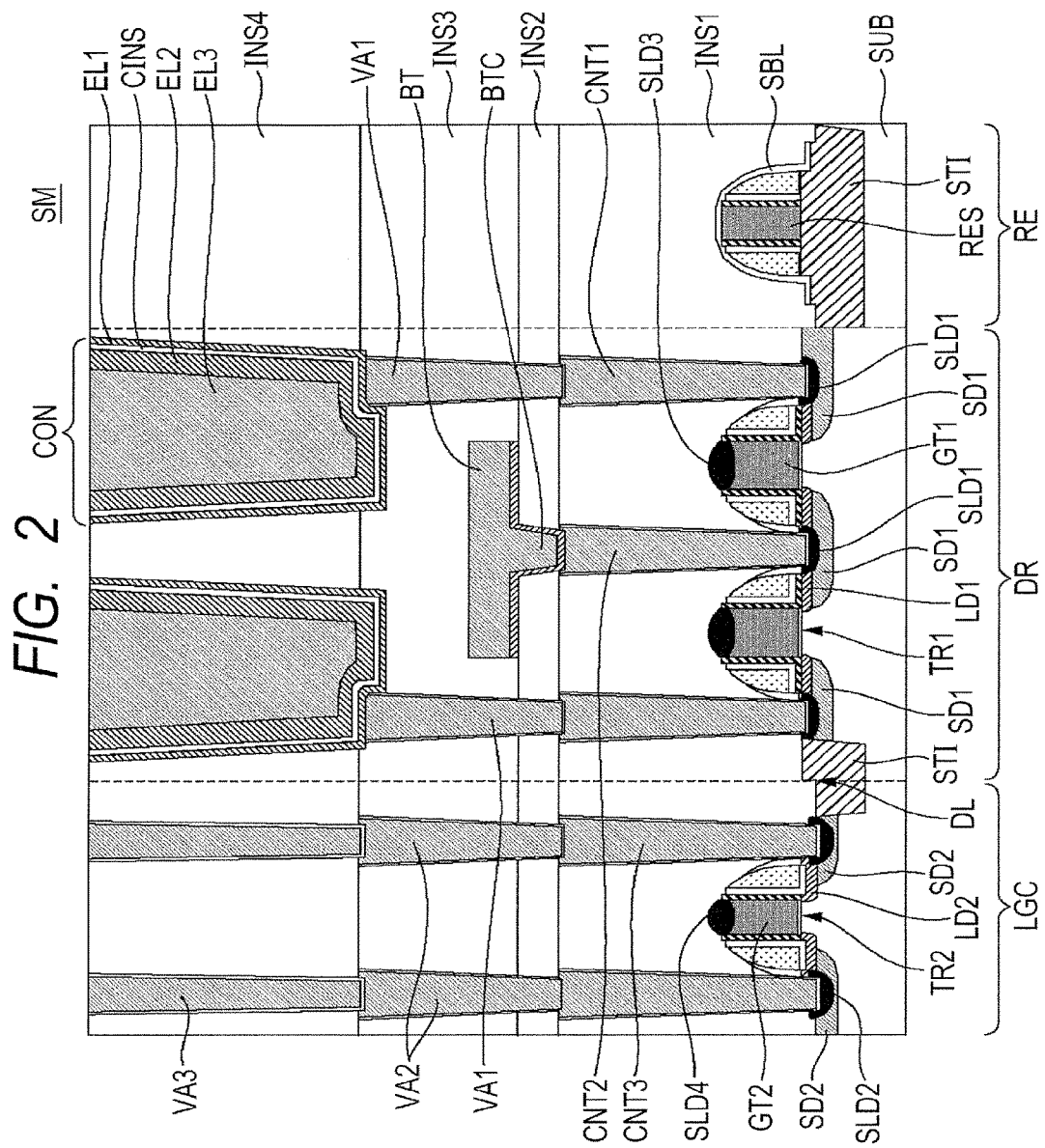
FIG. 2 is a cross sectional view of the semiconductor device.

FIG. 2 is a cross sectional view of the semiconductor device SM. The semiconductor device SM has a memory cell in a DRAM region DR, has a second transistor TR2 in a logic region LGC, and has a resistance device RES in a resistance forming region RE. The memory cell in the DRAM region DR has a capacitance device CON and a first transistor TR1.

Specifically, the semiconductor device SM is formed by using a substrate SUB. The substrate SB is, for example, a semiconductor substrate such as a silicon substrate. A multilayered interconnect layer is formed over the substrate SUB. The multilayered interconnect layer has interlayer insulating films INS1, INS2, INS3, and INS4. The interlayer insulating film INS1 is formed over the substrate SUB. The interlayer insulating films INS2, INS3, and INS4 are stacked in this order over the interlayer insulating film INS1.

The capacitance device CON is a device for storing information and buried in a trench formed in the interlayer insulating film INS4. Specifically, the capacitance device CON has a lower electrode EL1, a capacitance film CINS, an upper electrode EL2, and an upper electrode EL3. The lower electrode EL1 is formed along the bottom and the lateral side of the trench. The capacitance film CINS is formed over the lower electrode EL1 along the bottom and the lateral side of the trench. The upper electrode EL2 is formed over the capacitance film CINS along the bottom and the lateral side of the trench. The upper electrode EL3 is formed over the upper electrode EL2 and fills a remaining portion of the trench. The lower electrode EL1 comprises, for example, titanium nitride. The capacitance film CINS comprises, for example, zirconium oxide or tantalum oxide. The upper electrode EL2 comprises, for example, titanium nitride. The upper electrode EL3 comprises, for example, tungsten.

The first transistor TR1 is a transistor for writing and reading to and from the capacitance device CON. Accordingly, decrease in the leak current is required for the first transistor TR1. Specifically, the first transistor TR1 has a first LDD (Light Doped Drain) layer LD1 and a first diffusion layer SD1. The first diffusion layer SD1 is a diffusion layer that serves as a source and a drain. The first diffusion layer SD1 as a drain is coupled by way of a contact CNT2 to a bit line BT. The contact CNT2 is buried in the interlayer insulating film INS1. The bit line BT is formed over the interlayer insulating film INS2. The bit line BT is partially buried in the interlayer insulating film INS2, thereby forming a bit contact BTC. The bit contact BTC is coupled to the contact CNT2. Further, the first diffusion layer SD1 as a source is coupled by way of the contact CNT1 and via VA1 to the lower electrode EL1 of the capacitance device CON.

The first transistor TR1 further has a first gate electrode GT1, the first silicide layer SLD1, and a third silicide layer SLD3. The first silicide layer SLD1 is formed to the surface layer of the first diffusion layer SD1 and the silicide layer SLD3 is formed to the surface layer of the first gate electrode GT1. Details for the structure of the first transistor TR1 are to be described later with reference to FIG. 3.

The second transistor TR2 is a transistor forming a logic circuit. Accordingly, less power consumption, high speed operation, etc. are required for the second transistor TR2. The second transistor TR2 has a second gate electrode GT2, a second LDD layer LD2, a second diffusion layer SD2, a second silicide layer SLD2, and a fourth silicide layer SLD4. Since the first gate electrode GT2 is formed by the step identical with that for the first gate electrode GT1 of the first transistor TR1, it has a layer structure identical with the first gate electrode GT1.

In this embodiment, at least the uppermost layer of the second gate electrode GT2 and the first gate electrode GT1 is formed of a polysilicon layer. The width of the second gate electrode GT2 is less than the width of the first gate electrode GT1. The width of the first gate electrode GT1 is, for example, 1.2 times or more and twice or less the width of the second gate electrode GT2. The width of the second gate electrode GT2 is, for example, 50 nm or less. The second silicide layer SLD2 is formed in the surface layer of the second diffusion layer SD2, and the fourth silicide layer SLD4 is formed in the surface layer of the second gate electrode GT2.

The lower end of the contact CNT3 is coupled to the second diffusion layer SD2. The contact CNT3 is buried in the interlayer insulating film INS1 and coupled by way of a via VA2 to a via VA3. The via VA2 penetrates the interlayer insulating films INS2 and INS3. The via VA3 is buried in the interlayer insulating film INS4.

The upper surface of a portion of the substrate SUB in which the second diffusion layer SD2 is formed is lower than the upper surface of a portion in which the first diffusion layer SD1 is formed. The difference of the height between the two portions is, for example, 2 nm or more. Further, the difference of the height between the two portions is preferably 10 nm or less. As viewed in the direction of the thickness of the substrate SUB, the bottom of the second silicide layer SLD2 is situated below the bottom of the first silicide layer SLD1. Details for the structure of the second transistor TR2 are to be described with reference to FIG. 4.

A device isolation film ST1 is buried in the substrate SUB. A portion of the device isolation film ST1 that is situated between the DRAM region DR and logic region LGC isolates the two regions. Then, a step DL is formed at a portion of the device isolation film ST1 that is situated between the two regions. Further, a resistance device RES is formed over a portion of the device isolation film ST1 that is situated in the resistance forming region RE. The resistance device RES is polysilicon resistance and covered by a silicide block film SBL. The silicide block film SBL is, for example, an insulating film comprising an oxide film or the like.

Figure 3:
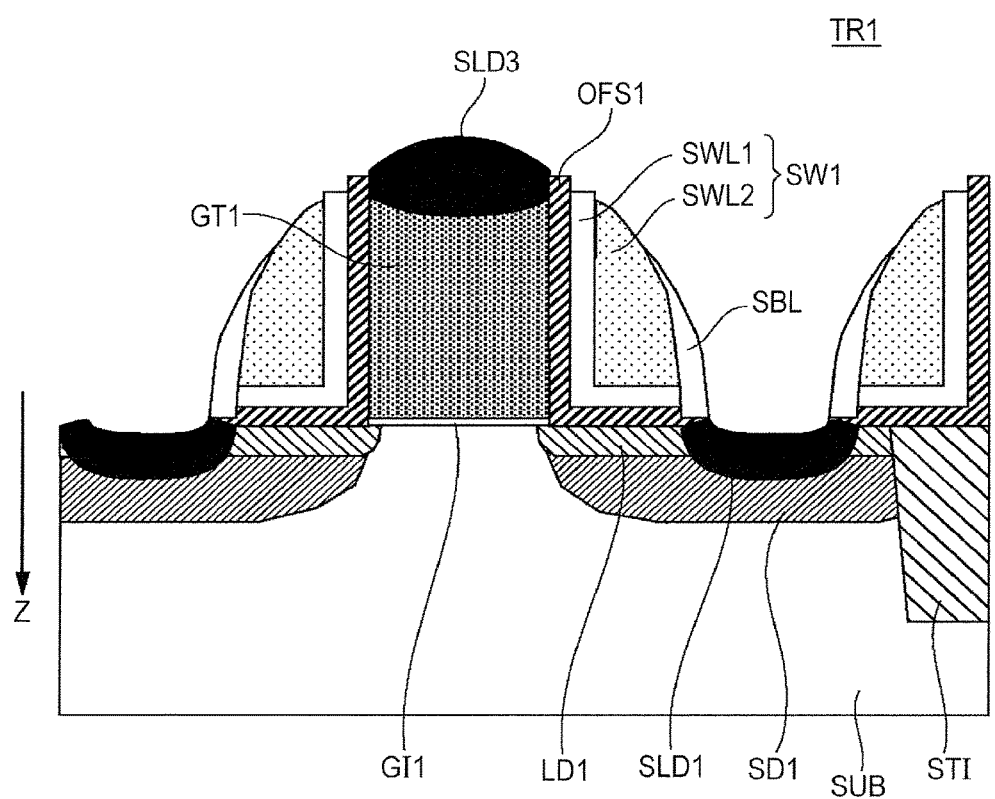
FIG. 3 is a cross sectional view illustrating a configuration of a first transistor.

FIG. 3 is a cross sectional view illustrating a configuration of the first transistor TR1. The first transistor TR1 has a first gate electrode GT1, a first LDD layer LD1, a first diffusion layer SD1, a first silicide layer SLD1, and a third silicide layer SLD3 and, in addition, a first gate insulating film GI1, a first offset spacer film OFS1, and a first side wall SW1.

The first gate insulating film GI1 may be a silicon oxide film, or a high dielectric film having a higher dielectric constant than the silicon oxide film. The first gate insulating film GI1 may be formed of a stacked film thereof. The first gate insulating film GI1 is situated between the substrate SUB and the first gate electrode GT1 and formed so as to be in contact with the surface of the substrate SUB.

A region between a pair of the first LDD layers LD1 in the substrate SUB below the first gate insulating film GI1 serves as a channel region. A first offset spacer film OFS1 is formed over the lateral side of the first gate electrode GT1. A first side wall SW1 is formed over the first offset spacer film OFS1. Specifically, the first offset spacer film OFS1 is formed between the lateral side of the first gate electrode GT1 and the lateral side of the first side wall SW1 on the side of the side wall insulating film SWL1.

The first offset spacer film OFS1 is formed also between the first side wall SW1 and the substrate SUB. Specifically, the first offset spacer film OFS1 is formed continuously on the side of the first gate electrode GT1 and the first gate insulating film GI1, and over the substrate SUB situated at the periphery thereof. Specifically, the first offset spacer film OFS1 is formed between the lower surface of the first side wall SW1 and the surface of the substrate SUB. The first offset spacer film OFS1 is formed so as to be in substantial constant with the surface of the substrate SUB below the lower surface of the first side wall SW1.

For example, the difference between the surface position of the substrate SUB at a portion below the lower surface of the first side wall SW1 and the surface position of the substrate SUB in contact with the first gate insulating film GI1 is made smaller than a corresponding difference in the second transistor TR2 to be described later in the direction of the depth from the surface of the substrate SUB to the inside of the substrate SUB (direction Z). Since the first LDD layer LD1 is in contact with the first silicide layer SLD1 with a configuration in which the difference between the surface position of the substrate SUB at a portion below the lower surface of the first side wall SW1 and the surface position of the substrate SUB in contact with the first gate insulating film GI1, device characteristics of the first transistor TR1 can be improved, and this also contributes to decrease in the leak current.

The first offset spacer film OFS1 is formed, for example, of an oxide film or a stack of a nitride film and an oxide film. The thickness of the first offset spacer film OSF1 is, for example, 80 nm or more and 150 nm or less. The first side wall SW1 is formed over the first offset spacer film OFS1. The first side wall SW1 is a film comprising a first side wall insulating film SWL1 and a second side wall insulating film SWL2 stacked in this order. The first side wall insulating film SWL1 is, for example, one of a silicon oxide film and a silicon nitride film, and the second side wall insulating film SWL2 is, for example, the other of the silicon oxide film and the silicon nitride film. The first side wall insulating film SWL1 is formed along the first offset spacer film OFS1. The second side wall insulating film SWL2 is formed to a thickness larger than that of the first side wall insulating film SWL1.

A portion of a silicide block film SBL further remains at the outer surface of the first side wall SW1. The lower end of the silicide block SBL present here is situated over the end of the first offset spacer film OFS1. A portion of the end of the first offset spacer film OFS1 that is in contact with the silicide block film SBL is decreased in the thickness than the portion covered by the first side wall SW1.

A first silicide layer SLD1 is formed to a portion of the substrate SUB that is not covered by the first side wall SW1. The upper surface of the first silicide layer SLD1 is situated at the surface of the substrate SUB and the lower surface of the first silicide layer SLD1 is situated in the first diffusion layer SD1. The first silicide layer SLD1 does not penetrate the first diffusion layer SD1. In the direction Z, the position at the bottom of the first silicide layer SLD1 to the surface position of the substrate SUB below the first gate insulating film GI1 is formed to a depth less than the position at the bottom of the second silicide layer SLD2 to the surface position of the substrate SUB below the second gate insulating film GI2 of the second transistor TR2 to be described later.

Device characteristics of the first transistor TR1 can be improved and this also contributes to decrease in the leak current.

Figure 4:
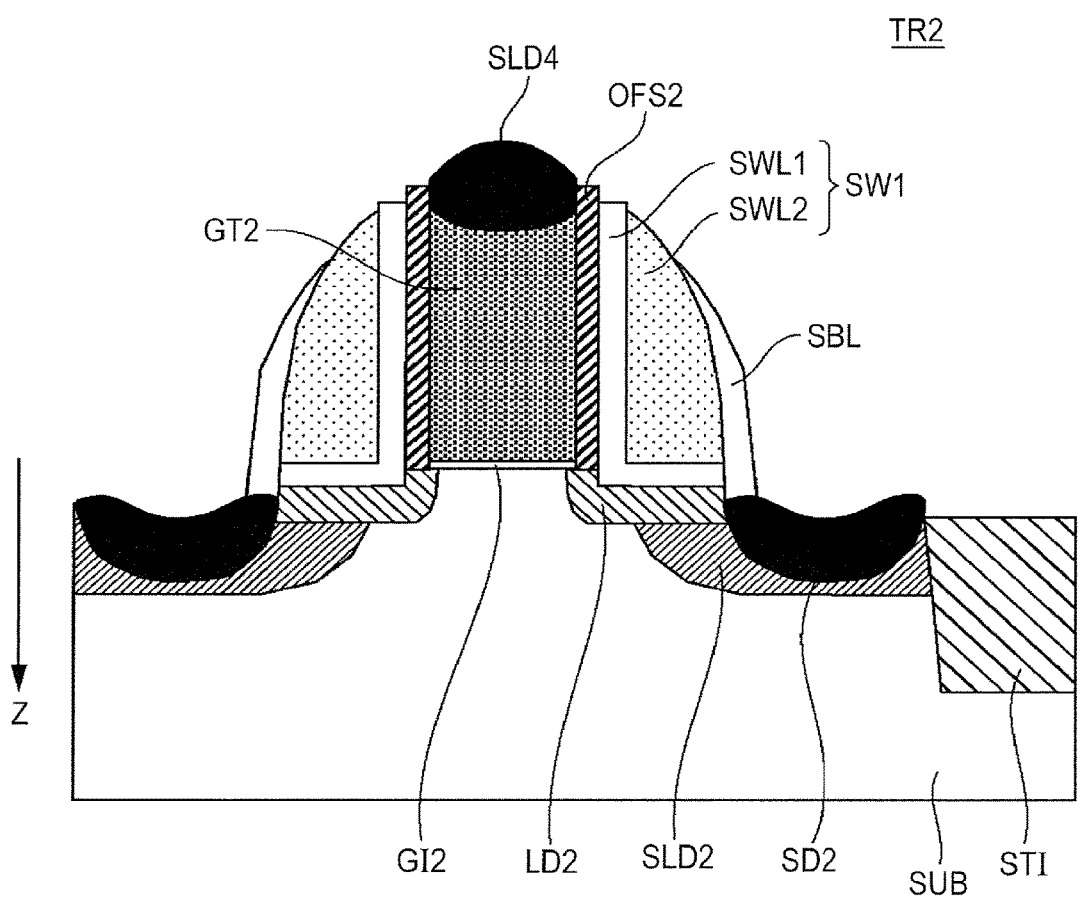
FIG. 4 is a cross sectional view illustrating a configuration of a second transistor.

FIG. 4 is a cross sectional view illustrating a configuration of a second transistor TR2. The second transistor TR2 has a second gate electrode GT2, a second LDD layer LD2, second diffusion layer SD2, a second silicide layer SLD2, and a fourth silicide layer SLD4 and, in addition, a second gate insulating film GI2, a second offset spacer film OFS2, and a second side wall SW2. The width of the second gate electrode GT2 is narrower than the width of the first gate electrode GT1. Accordingly, the channel length of the second transistor TR2 is shorter than the channel length of the first gate electrode GT1.

The second gate insulating film GI2 is situated between the substrate SUB and the second gate electrode GT2 and formed over the surface of the substrate SUB. A region of the substrate SUB below the second gate insulating film GI2 and between a pair of the second LDD layers LD2 serves as a channel region.

The second gate insulating film GI2 may be a silicon oxide film or a high dielectric film having a dielectric constant higher than that of the silicon oxide film, or may be a stacked film thereof. The second gate insulating film GI12 may be formed by the step identical with that for the first gate insulating film GI1 or may be formed to a thickness different from that of the gate insulating film GI1 by the step different from that for the first gate insulating film GI1. In any of the cases, the step DL of the device isolation film STI illustrated in FIG. 2 is formed.

The second offset spacer film OFS2 is formed over the lateral side of the second gate electrode GT2. The second offset spacer film OFS2 is formed, for example, of an oxide film or a stacked layer of a nitride film and an oxide film. The thickness of the second offset spacer film OFS2 is, for example, 80 nm or more and 150 nm or less. The second offset wall SW2 is formed over the lateral side of the second offset spacer film OFS2. The structure of the second side wall SW2 is identical with the structure of the first side wall SW1. Different from the first offset spacer film OFS1, the second offset spacer film OFS2 is not formed between the second side wall SW2 and the substrate SUB.

Owing to the structure, the upper surface for the portion of the substrate SUB in which the second diffusion layer SD2 is formed is lower than the upper surface of the portion of the substrate SUB in which the first diffusion layer SD1 is formed.

Specifically, the second offset spacer film OFS2 is formed only over the lateral side of the second gate electrode GT2. A first side wall insulating film SWL1 of the second side wall SW2 is formed along the second offset spacer film OFS2 and the substrate SUB. The second offset spacer film OFS2 is formed between the lateral side of the second gate electrode GT2 and the lateral side of the second side wall SW2 on the side of the first side wall insulating film SWL1, and the second offset spacer film OFS2 is not formed to a portion below the lower surface of the second side wall SW2.

In the direction Z, the lower surface of the second side wall SW2 is formed to a position deeper than the surface position of the substrate SUB that is in contact with the second gate insulating film GI2 and the lower surface of the second offset spacer film OFS2. In the direction Z, the difference between the lower surface of the second side wall SW2 and the surface position of the substrate SUB that is in contact with the second gate insulating film GI2 is larger than the difference between the surface position of the substrate SUB at the portion below the lower surface of the first side wall SW1 and the surface position of the substrate SUB that is in contact with the second gate insulating film GI2.

Since a plurality of first transistors TR1 are arranged orderly in the DRAM region DR, whereas a plurality of second transistors TR2 are arranged at random in the logic region LGC, thickness of the second offset spacer film OFS2 varies more in the logic region LGC during film deposition of the offset spacer film. When the second offset spacer film OFS2 is formed so as to be left only over the lateral side of the second gate electrode GT2, the effect caused by the variation of the thickness of the second offset spacer film OFS2 in the logic region LGC can be decreased, and the device characteristics of the second transistor TR2 can be improved and this contributes to high speed operation.

As viewed in the direction of the thickness of the substrate SUB (direction Z), the upper end of the first silicide layer SLD1 is situated to the lower end of the gate electrode GT1 at an identical depth, whereas the upper end of the second silicide layer SLD2 is situated below the lower end of the gate electrode GT2. In the direction Z, the upper end of the second silicide layer SLD2 is formed deeper than the upper end of the first silicide layer SLD1 to the inside of the substrate SUB. In the direction Z, the position of the bottom of the first silicide layer SLD1 to the surface position of the substrate SUB below the first gate insulating film GI1 is formed shallower than the position of the bottom of the second silicide layer SLD2 to the surface position of the substrate SUB below the second gate insulating film GI2 of the second transistor TR2.

FIG. 5 to FIG. 10 are cross sectional views illustrating a method of manufacturing a semiconductor device according to this embodiment. At first, as illustrated in FIG. 5A, a device isolation film STI is formed in a substrate SUB. Then, a first gate insulating film GI1 and a second gate insulating film GI2 are formed over the substrate SUB. The first gate insulating film GI1 and the second gate insulating film GI2 may be formed by one identical step, or the first gate insulating film GI1 may be formed to a thickness larger than that of the second gate insulating film GI2 by a multi-oxide method.

Then, an electroconductive film to be a first gate electrode GT1 and the second gate electrode GT2 are formed over the first gate insulating film GI1, over the second gate insulating film GI2, and over the device isolation film ST1. Then, the electroconductive film is removed selectively. Thus, the first gate electrode GT1 and the second gate electrode GT2 are formed. Further, a resistance device RES is also formed by the step. The resistance device RES is a polysilicon layer. The polysilicon layer is formed by the step identical with that for the polysilicon layer forming the first gate electrode GT1 and the second gate electrode GT2.

Figure 5A:
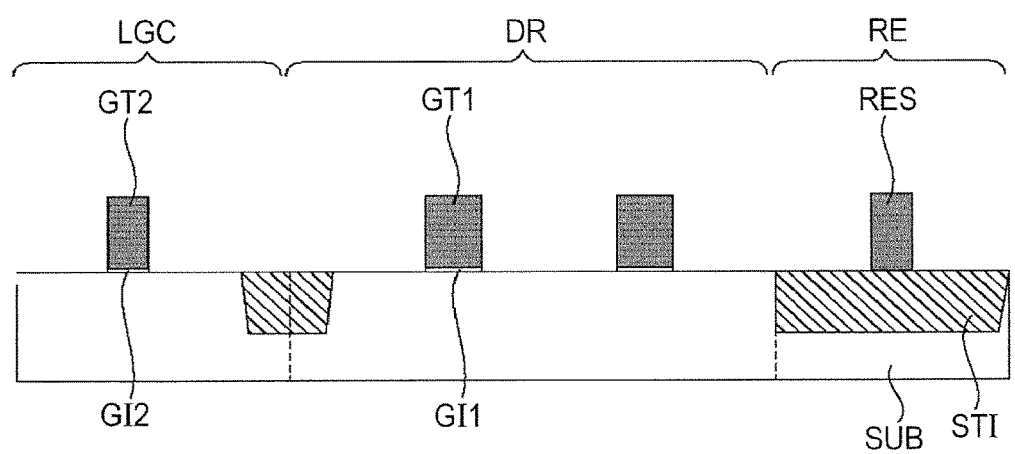
FIGS. 5A and 5B are cross sectional views illustrating a method of manufacturing a semiconductor device according to this embodiment.
Figure 5B:
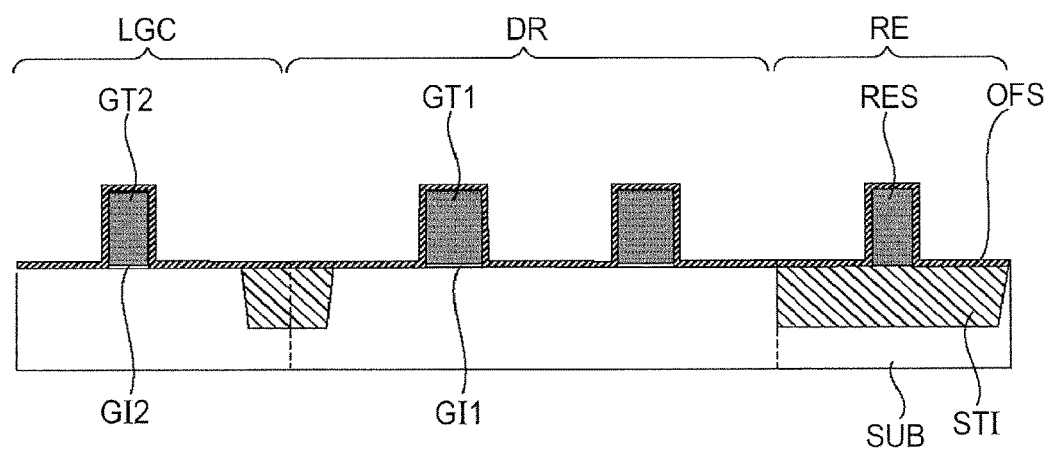

Then, as illustrated in FIG. 5B, an offset spacer film OFS is formed over the substrate SUB, over the device isolation film ST1, over the lateral side and the upper surface of the first gate electrode GT1, over the lateral side and the upper surface of the second gate electrode GT2, and over the lateral side and the upper surface of the resistance device RES, for example, by using a thermal CVD method or an ALD method.

Figure 6A:
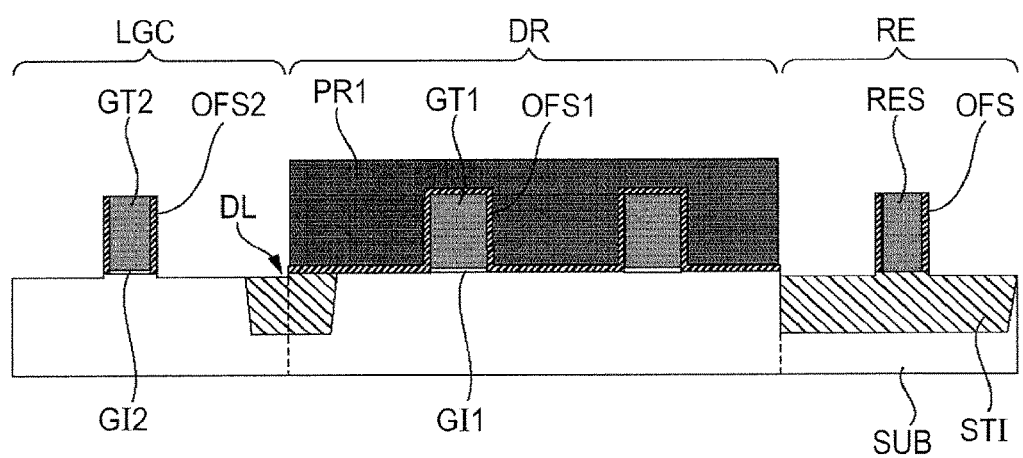
FIGS. 6A and 6B are cross sectionals view illustrating a method of manufacturing a semiconductor device according to this embodiment.

Then, as illustrated in FIG. 6A, a portion of the offset spacer film OFS that is situated in the DRAM region DR is covered by a first resist film PR1. Then, the offset spacer film OFS is anisotropically etched by using the first resistance film PR1 as a mask. Thus, the offset spacer film OFS is removed at a portion situated over the substrate SUB and over the device isolation film STI situated in a logic region LDC, at a portion situated over the device isolation film STI in a resistance forming region RE, at a portion situated over the gate electrode GT2, and at a portion situated over the resistance device RES. Thus, a first offset spacer film OFS1 and a second offset spacer film OFS2 are formed. Further, the lateral side of the resistance device RES is also covered by the offset spacer film OFS.

A step DL is formed by the etching to a portion of the device isolation film STI that is situated at the boundary between the DRAM region DR and the logic region LGC, and a portion of the upper surface of the substrate SUB that is situated in the logic region LGC is made lower than the portion of the upper surface of the substrate SUB that is situated in the DRAM region DR. Further, the portion of the upper surface of the device isolation film STI that is situated in the resistance forming region RE not covered by the resistance device RES is made lower than the portion covered by the resistance device RES. In the direction Z, the surface position of the substrate SUB that is not covered by the first gate electrode GT1, the second gate electrode GT2, the first offset spacer film OFS1, and the second offset spacer film OFS2 is made lower than the surface position at a portion of the substrate SUB that is covered by the first gate electrode GT1, the second gate electrode GT2, the first offset spacer film OFS1, and the second offset spacer film OFS2 (to the side of the substrate SUB).

In the step, the substrate SUB situated in the DRAM region DR is not etched by being protected by the first resist film PR1. Accordingly, the substrate SUB situated in the DRAM region DR does not undergo damages due to etching with the crystallinity being kept satisfactory as it is. Thus, the leak current of the first transistor TR1 is decreased.

Figure 6B:
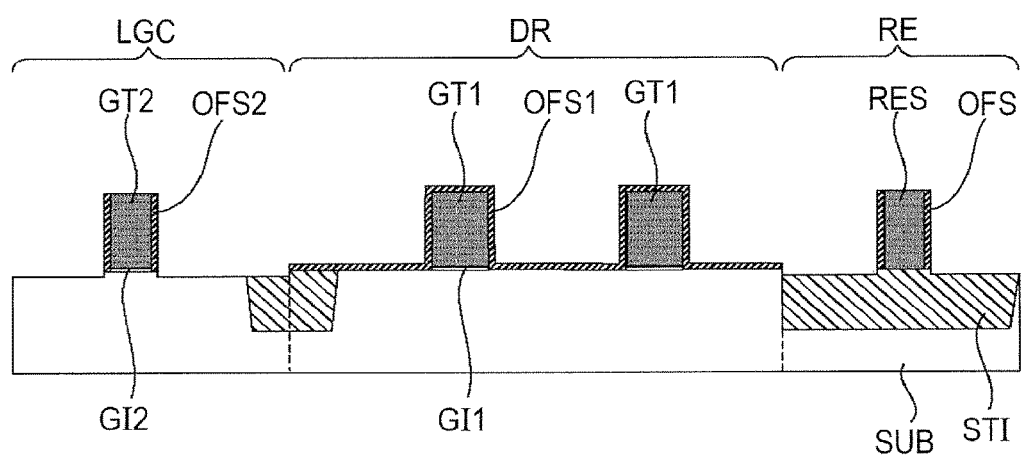

Then, as illustrated in FIG. 6B, the first resist film PR1 is removed.

Figure 7A:
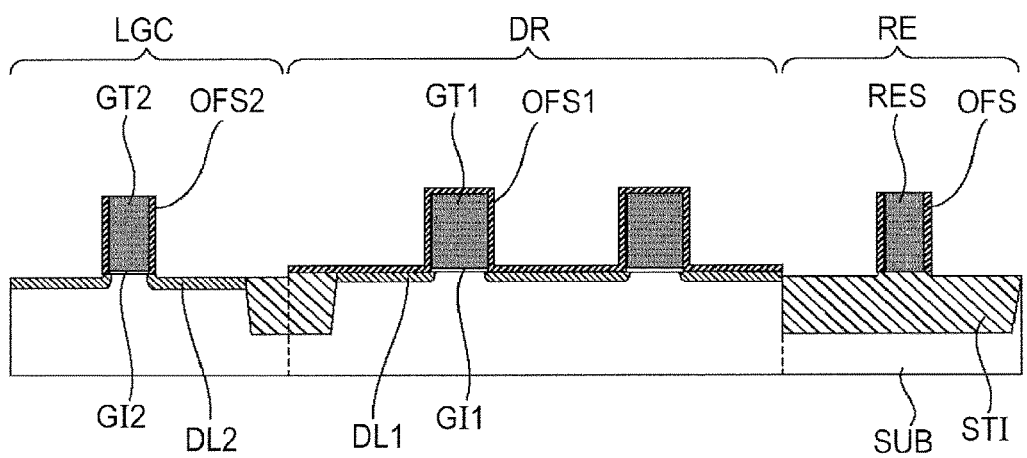
FIGS. 7A and 7B are cross sectional views illustrating a method of manufacturing a semiconductor device according to this embodiment.

Then, as illustrated in FIG. 7A, impurity ions are implanted into the substrate SUB by using the lateral side of the first offset spacer film OFS1 and the second offset spacer film OFS2, the device isolation film ST1, the first gate electrode GT1, and the second gate electrode GT2 as a mask. Thus, a first LDD layer LD1 and a second LDD layer LD2 are formed.

As described above, since the substrate SUB situated in the DRAM region DR is protected by the first resist film PR1 in the step of anisotropically etching the offset spacer film OFS, silicon is not etched and the step is not formed. Accordingly, during ion implantation for forming the first LDD layer LD1, sneaking of implanted ions below the first gate electrode GT1 is suppressed. Thus, the leak current of the first transistor TR1 is decreased.

Figure 7B:
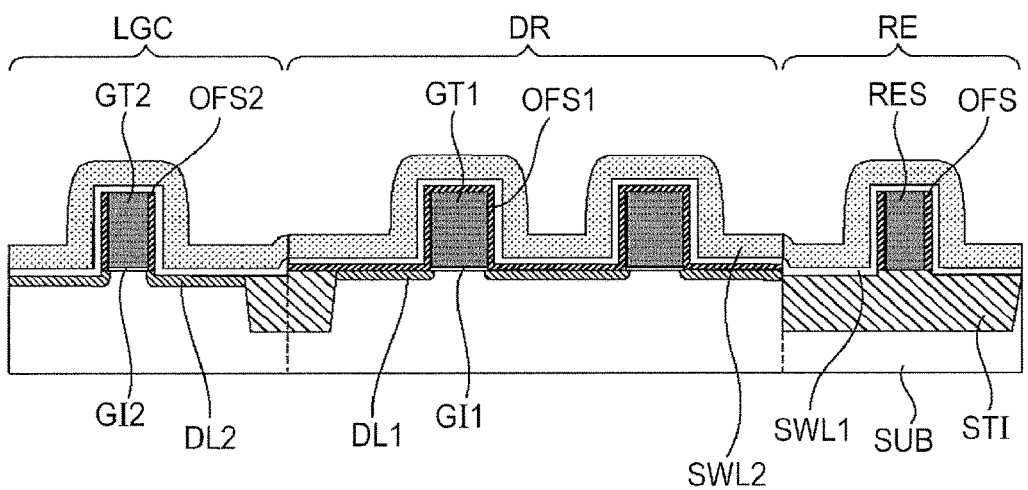

Then, as illustrated in FIG. 7B, a first side wall insulating film SWL1 and a second side wall insulating film SWL2 are formed in this order over the entire surface including over the substrate SUB and the device isolation film STI, over the offset spacer film OFS1, over the second offset spacer film OFS2, and over the offset spacer film OFS. The first side wall insulating film SWL1 and the second side wall insulating film SWL2 are formed, for example, by a thermal CVD method or an ALD method.

Figure 8A:
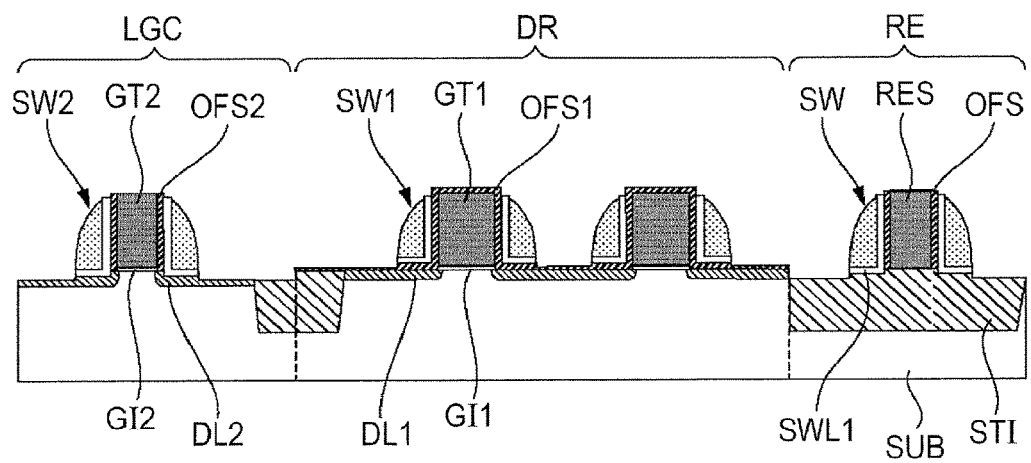
FIGS. 8A and 8B are cross sectional views illustrating a method of manufacturing a semiconductor device according to this embodiment.

Then, as illustrated in FIG. 8A, the first side wall insulating film SWL1 and the second side wall insulating film SW2 are etched back by using anisotropical etching. Thus, the first side wall SW1 and the second side wall SW2 are formed. A side wall SW is formed also over the lateral wall of the resistance device RES.

Figure 8B:
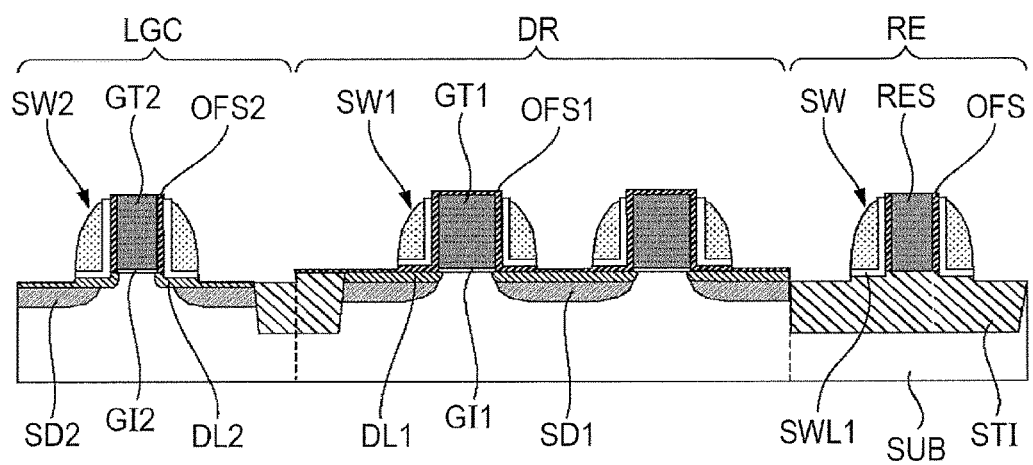

Then, as illustrated in FIG. 8B, ions are implanted into the substrate SUB by using the first side wall SW1, the second side wall SW2, the first gate electrode GT1, the second gate electrode GT2, and the device isolation film ST1 as a mask. Thus, a first diffusion layer SD1 and a second diffusion layer SD2 are formed.

In the step, the substrate SUB situated in the DRAM region DR is not etched due to the presence of the first offset spacer. Accordingly, the substrate SUB situated in the DRAM region DR does not undergo damages by etching with crystallinity being kept satisfactory as it is. Thus, leak current of the first transistor TR1 is decreased.

As described above, in the step of anisotropically etching the side wall film, since the substrate SUB is not etched and the step is not formed, sneaking of implanted ions below the first gate electrode GT1 is suppressed during ion implantation for forming the first diffusion layer SD1. Thus, the leak current of the first transistor TR1 is decreased.

Figure 9A:
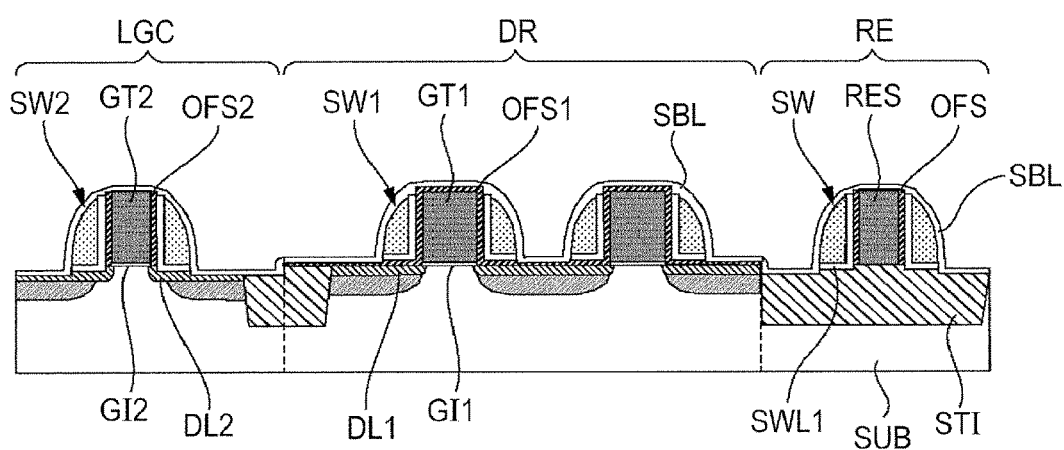
FIGS. 9A and 9B are cross sectional views illustrating a method of manufacturing a semiconductor device according to this embodiment.

Then, as illustrated in FIG. 9A, a silicide block film SBL is formed over the entire surface including over the first gate electrode GT1, over the second gate electrode GT2, over the resistance device RES, over the first side wall SW1, over the second side wall SW2, and over the side wall SW. The silicide block film SBL is formed, for example, by a thermal CVD method or an ALD method.

Figure 9B:
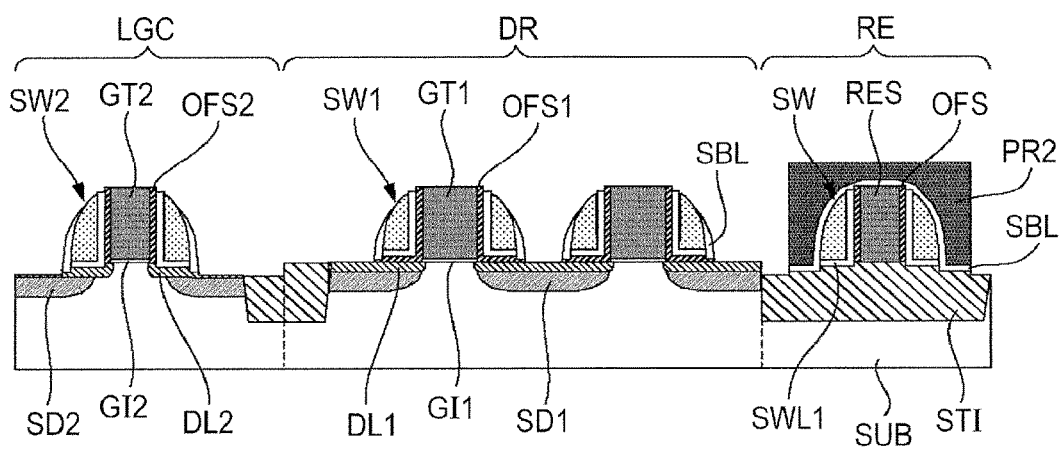

Then, as illustrated in FIG. 9B, a region of the silicide block film SBL to be left, that is, a region in which silicide is not to be formed (for example, resistance device RES) is covered by a second resistance film PR2. Then, the silicide block film SBL is etched by using the second resist film PR2 as a mask. Thus, a region of the silicide block SBL that is not covered by the second resistance film PR2 is removed. In the silicide block film SBL, a portion situated over the first side wall SW1 and a portion situated over the second side wall SW2 are left partially.

Figure 10A:
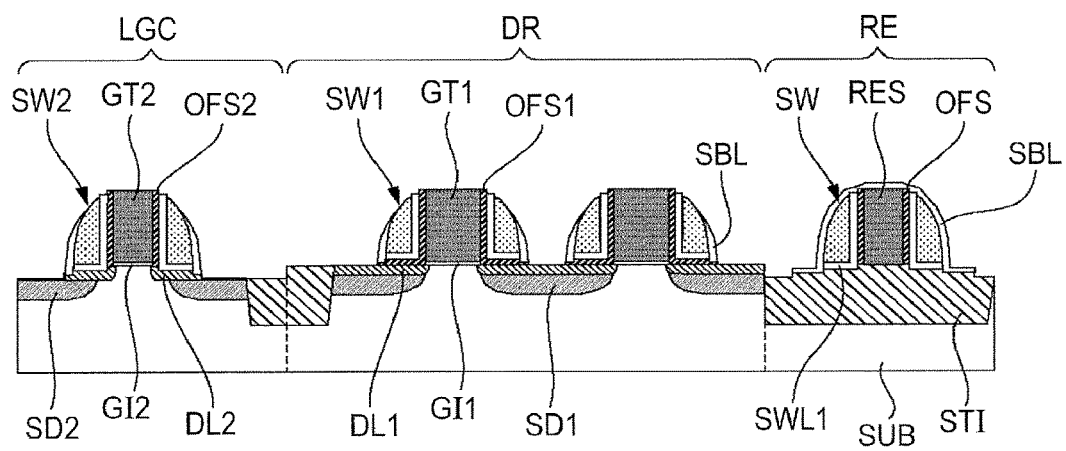
FIGS. 10A and 10B are cross sectional views illustrating a method of manufacturing a semiconductor device according to this embodiment.

Then as illustrated in FIG. 10A, the second resist film PR2 is removed.

Figure 10B:
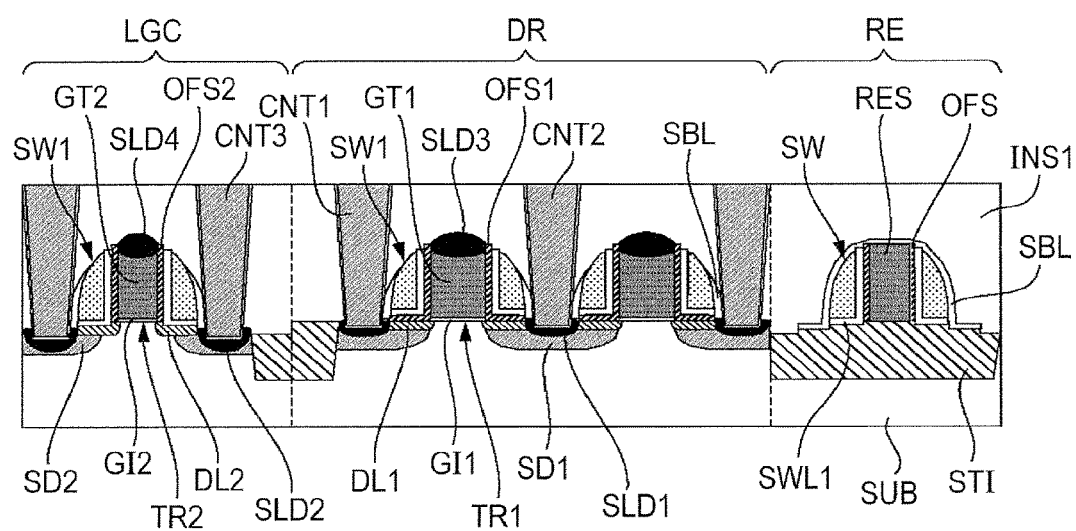

Then as illustrated in FIG. 10B, a metal film (for example, of Ni) to form the silicide is deposited and a heat treatment is applied. Thus, a first silicide layer SLD1, a second silicide layer SLD2, a third silicide layer SLD3, and a fourth silicide layer SLD4 are formed. Then, the metal film that is left without silicidation is removed.

Then, an interlayer insulating film INS1 is formed and, further, a connection hole is formed in the interlayer insulating film INS1. Then, an electroconductive film is buried in the connection hole. Thus, a contact CNT1, a contact CNT2, and a contact CNT3 are formed.

Then, in interlayer insulating film INS2, a bit line BT, an interlayer insulating film INS3, and a via VA1 and a via VA2 are formed in this order. Then, an interlayer insulating film INS4 is formed over the interlayer insulating film INS3, and the via VA1 and VA2.

Then, a trench is formed in the interlayer insulating film INS4 for burying a capacitance device CON. Then, a lower electrode EL1, a capacitance film CINS, an upper electrode EL2, and an upper electrode EL3 are formed in this order in the trench and over the interlayer insulating film INS4. Then, the lower electrode EL1, the capacitance film CINS, the upper electrode EL2, and the upper electrode EL3 situated over the interlayer insulating film INS4 are removed. Thus, the capacitance device CON is formed. Then, a via VA3 is buried in the interlayer insulating film INS4.

In this embodiment, the first side wall SW1 and the second side wall SW2 may have a single-layered structure.

Figure 11:
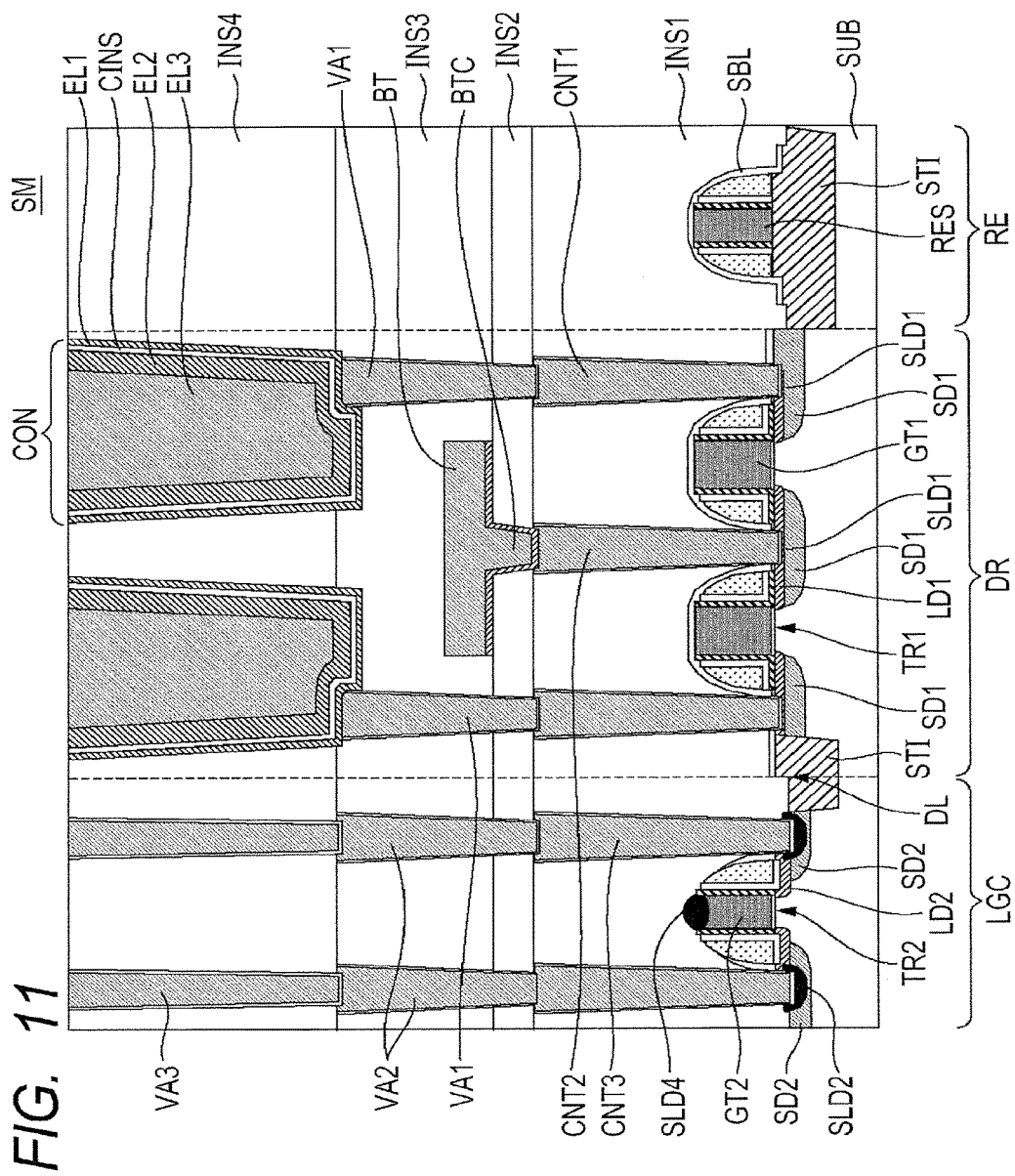
FIG. 11 is a cross sectional view of a semiconductor device according to a modified embodiment.

Further, the first silicide layer SLD1 and the third silicide layer SLD3 may not be formed as illustrated in FIG. 11. In this case, the DRAM region DR is also covered by the second resist film PR2 in the step illustrated in FIG. 9B. Accordingly, the silicide block SBL is left in the DRAM region DR.

Then, the function and the effect provided by this embodiment are to be described. According to this embodiment, when the offset spacer film OFS is removed partially to form the first offset spacer film OFS1 and the second offset spacer film OFS2, the substrate SUB situated in the DRAM region DR is covered by the first resist film PR1. Therefore, the substrate SUB situated in the DRAM region DR is not etched and does not undergo damages when the offset spacer film OFS is removed partially.

As a result, the substrate SUB situated in the logic region LGC is situated below the substrate SUB situated in the DRAM region DR. Then, the substrate SUB situated in the DRAM region DR does not undergo the damages due to etching with the crystallinity being left satisfactory as it is. Thus, leak current of the first transistor TR1 is decreased. Further, during ion implantation for forming the first LDD layer LD1, sneaking of implanted ions below the first gate electrode GT1 can be suppressed. This further decreases the leak current of the first transistor TR1.

Further, in this embodiment, the first silicide layer SLD1 is formed to the first diffusion layer SD1 of the first transistor TR1. When the first silicide layer SLD1 is formed, the contact resistance of the contact CNT1 and the first diffusion layer SD1 can be lowered. On the other hand, when the first silicide layer SLD1 is formed, it is necessary to increase the depth of the first diffusion layer SD1 for suppressing generation of the leak current. As the first diffusion layer SD1 becomes deeper, ions implanted for forming the first diffusion layer SD1 tend to sneak below the first gate electrode GT1. Since such sneaking can be suppressed in this embodiment, the first silicide layer SLD1 can be formed to the first diffusion layer SD1 of the first transistor TR1.

Second Embodiment

Figure 12:
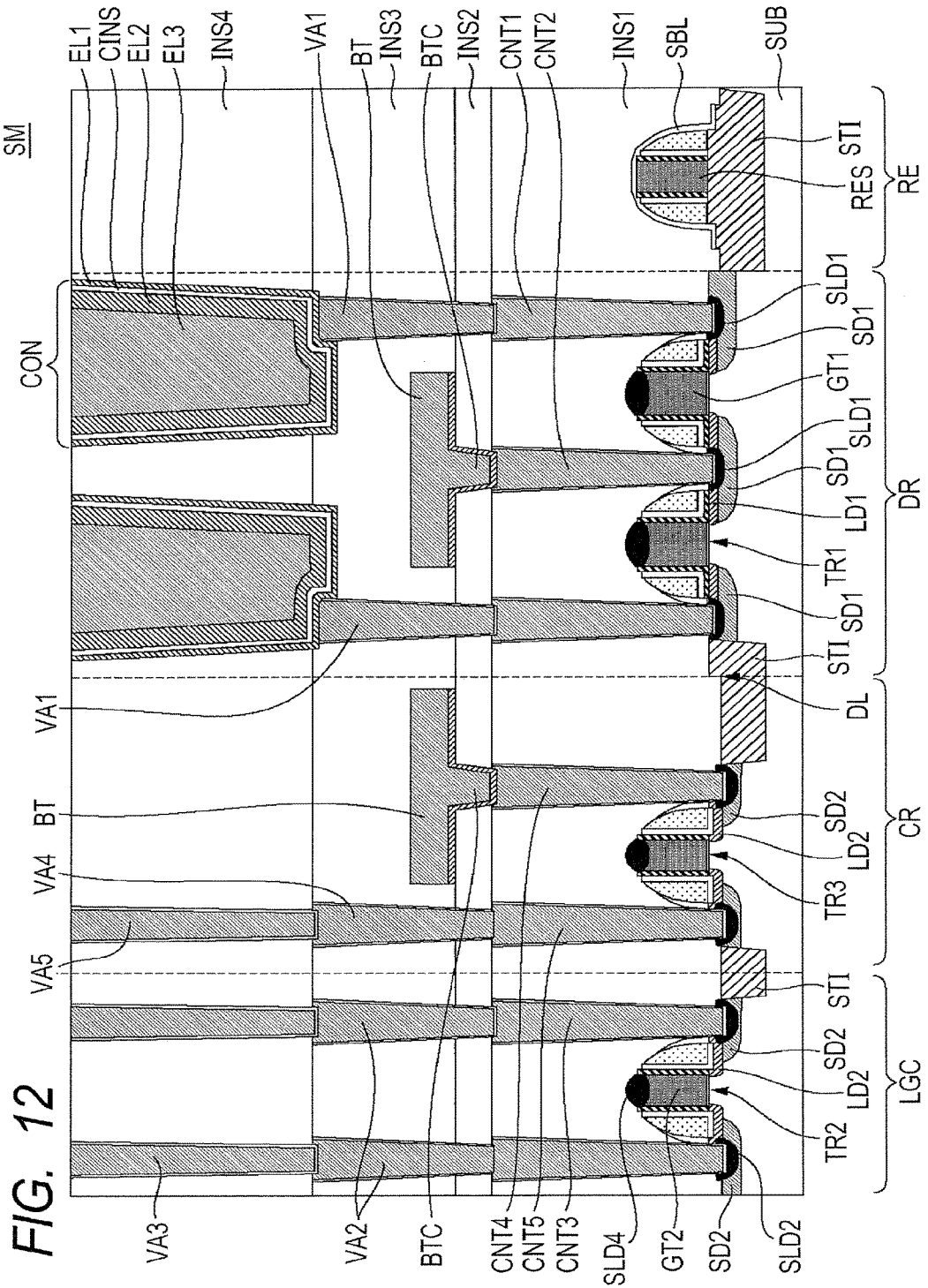
FIG. 12 is a cross sectional view of a semiconductor device according to a second embodiment.

FIG. 12 is a cross sectional view illustrating a configuration of a semiconductor device SM according to a second embodiment which corresponds to FIG. 2 for the first embodiment. The semiconductor device SM according to this embodiment is identical with the semiconductor device SM according to the first embodiment excepting that a transistor TR3 forming the peripheral circuit CR has a structure identical with the second transistor TR2.

Specifically, a third transistor TR3 has a second diffusion layer SD2 that serves as a source and a drain. The second diffusion layer SD2 as the drain is coupled by way of a contact CNT5 and a via VA4 to a via VA5. The second diffusion layer SD2 as the source is connected by way of a contact CNT4 to a bit line BT. The contacts CNT4 and CNT5 are buried in an interlayer insulating film INSI and the via VA4 penetrates interlayer insulating films INS3 and INS2. Further, the via VA5 is buried in an interlayer insulating film INS4.

Also this embodiment can provide the same effect as the first embodiment.

While the invention made by the present inventors have been described specifically with reference to the embodiments, it will be apparent that the present invention is not restricted to the embodiments but can be modified variously within a range not departing the gist thereof. For example, in the embodiments described above while explanation has been made to a case where the first transistor TR1 forms a memory cell of the DRAM, it is apparent that the invention is not restricted thereto but is applicable also to other types of memories.

Further, the invention is applicable not only to the memory but also to circuits in which the leak current should be decreased. Particularly, this is effective to a case where the transistors are arranged orderly. Further, more preferred transistor characteristics can be obtained by combined use of a technique of changing the width of the side walls between the transistor for memory and the transistor for logic circuit as illustrated in Japanese Unexamined Patent Application Publication No. 2002-69562. In this case, the second side wall SW2 of the second transistor TR2 is narrower than the first side wall SW1 of the first transistor TR1.

What is claimed is:

1. A method of manufacturing a semiconductor device, comprising:
    forming a first gate electrode of a first transistor in a first region and a second gate electrode of a second transistor in a second region over a substrate;
    forming an offset spacer film over the substrate in the first and the second region to cover the first gate electrode and the second gate electrode;
    selectively etching the offset spacer film formed in the second region to expose an upper surface of the second gate electrode and an upper surface of the substrate around the second gate electrode in the second region, while leaving the offset spacer film formed in the first region and the offset spacer film formed on sides of the second gate electrode;
    forming a first insulating film on the offset spacer film formed in the first region, the second gate electrode, the offset spacer film formed on the sides of the second gate electrode and the substrate in the second region;
    forming a second insulating film to cover the first insulating film;
    forming first sidewalls on sides of the offset spacer film formed on the first gate electrode and second sidewalls on sides of the offset spacer film formed on the sides of the second gate electrode by etching back the first and the second insulating film; and
    implanting ions in the substrate by using the first gate electrode, the offset spacer film formed on the sides of the first gate electrode, the first sidewalls, the second gate electrode, the offset spacer film formed on the sides of the second gate electrode, and the second sidewalls as a mask, thereby to form a first diffusion layer for a source and a drain of the first transistor and a second diffusion layer for a source and a drain of the second transistor,
    wherein, by the selective etching of the offset spacer film, an upper surface of a portion of the substrate in the first region is located higher than an upper surface of a portion of the substrate in the second region in cross-section view, and
    wherein the second sidewalls are formed such that the second sidewalls are in contact with the upper surface of the portion of the substrate in the second region.

2. The method of manufacturing the semiconductor device according to claim 1, further comprising:
    implanting ions in the substrate by using the first gate electrode, the offset spacer film formed on the sides of the first gate electrode, the second gate electrode, and the offset spacer film formed on the sides of the second gate electrode as a mask, thereby to form a first LDD (Lightly Doped Drain) region of the first transistor and a second LDD region of the second transistor, before the forming of the first insulating film.

3. The method of manufacturing the semiconductor device according to claim 2,
    wherein the implanting of the ions in the substrate to form the first and the second LDD regions is performed such that a bottom surface of the first LDD region is located higher than a bottom surface of the second LDD region in cross-section view.

4. The method of manufacturing the semiconductor device according to claim 1, further comprising:
    forming a silicide block film on the first sidewalls and the second sidewalls after the forming of the first and the second diffusion layer; and
    forming a first silicide layer on the first diffusion layer, a second silicide layer on the second diffusion layer, a third silicide layer on the first gate electrode, and a fourth silicide layer on the second gate electrode.

5. The method of manufacturing the semiconductor device according to claim 1, the selectively etching the offset spacer film comprising:
    forming a mask film to cover the first region;
    etching the offset spacer film using the mask film as a mask; and
    removing the mask film formed in the first region.

6. The method of manufacturing the semiconductor device according to claim 1,
    wherein the upper surface of the portion of the substrate in the first region is located under the first sidewalls, and
    wherein the upper surface of the portion of the substrate in the second region is located under the second sidewalls.

7. The method of manufacturing the semiconductor device according to claim 1,
    wherein the first region is a dynamic random access memory region, and the second region is a logic region.

* * * * *